(12) United States Patent
Zhang et al.

(10) Patent No.: US 11,997,794 B2
(45) Date of Patent: May 28, 2024

(54) DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Shuang Zhang, Beijing (CN); Xiaoxia Huang, Beijing (CN); Jiangsheng Wang, Beijing (CN); Jianjun Wu, Beijing (CN); Xuerui Gong, Beijing (CN); Bing Ji, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/134,376

(22) Filed: Apr. 13, 2023

(65) Prior Publication Data
US 2023/0254978 A1 Aug. 10, 2023

Related U.S. Application Data

(63) Continuation of application No. 16/964,109, filed as application No. PCT/CN2019/114879 on Oct. 31, 2019, now Pat. No. 11,665,827.

(51) Int. Cl.
*H05K 1/18* (2006.01)
*G06F 3/041* (2006.01)
(Continued)

(52) U.S. Cl.
CPC ........... *H05K 1/189* (2013.01); *G06F 3/0412* (2013.01); *H01L 25/18* (2013.01); *H05K 1/0281* (2013.01);
(Continued)

(58) Field of Classification Search
CPC .... H05K 1/189; H05K 1/0281; H05K 1/0209; H05K 2201/10128; H05K 2201/10151;
(Continued)

(56) References Cited

U.S. PATENT DOCUMENTS

| 10,306,766 | B2 | 5/2019 | Shi |
| 2013/0321382 | A1 | 12/2013 | Nagao |
| 2018/0182838 | A1 | 6/2018 | Yeo |

FOREIGN PATENT DOCUMENTS

| CN | 204884440 U | 12/2015 |
| CN | 107728365 A | 2/2018 |

(Continued)

OTHER PUBLICATIONS

U.S. Notice of Allowance in U.S. Appl. No. 16/964,109 dated Jan. 30, 2023.
(Continued)

*Primary Examiner* — Anne M Hines
*Assistant Examiner* — Jose M Diaz
(74) *Attorney, Agent, or Firm* — Collard & Roe, P.C.

(57) ABSTRACT

A display device is provided. The display device includes: a display substrate having a non-display side, a first driver being provided at the non-display side of the display substrate; a touch module comprising a touch layer and a touch flexible circuit board connected with the touch layer, the touch flexible circuit board comprising a flat portion located at a side of the second portion away from the first portion and a second bent portion for connecting the touch layer and the flat portion; and a supporting wall between the flat portion of the touch flexible circuit board and the second portion of the display substrate, and the supporting wall is located on at least one side of the first driver in a direction parallel to the flat portion of the touch flexible circuit board.

14 Claims, 7 Drawing Sheets

(51) Int. Cl.
  *H01L 25/18* (2023.01)
  *H05K 1/02* (2006.01)
  *H10K 50/87* (2023.01)
  *H10K 102/00* (2023.01)

(52) U.S. Cl.
  CPC ... *H10K 50/87* (2023.02); *H05K 2201/10128* (2013.01); *H05K 2201/10151* (2013.01); *H05K 2201/10537* (2013.01); *H05K 2201/2009* (2013.01); *H10K 2102/311* (2023.02)

(58) Field of Classification Search
  CPC . H05K 2201/10537; H05K 2201/2009; H05K 3/361; G06F 3/0412; G06F 2203/04103; H01L 25/18; H10K 50/87; H10K 2102/311; H10K 59/40; H10K 77/111; G02F 1/1333
  See application file for complete search history.

(56) References Cited

FOREIGN PATENT DOCUMENTS

| CN | 108682369 A | 10/2018 |
| CN | 109032417 A | 12/2018 |
| CN | 110007497 A | 7/2019 |

OTHER PUBLICATIONS

International Search Report of PCT/CN2019/114879 in Chinese, dated Jul. 17, 2020, with English translation.
Written Opinion of the International Searching Authority of PCT/CN2019/114879 in Chinese, dated Jul. 17, 2020 with English translation.

DISPLAY DEVICE

CROSS-REFERENCE TO RELATED APPLICATIONS

This application is a continuation of U.S. patent application Ser. No. 16/964,109 filed on Jul. 22, 2020 which is a national stage application of an international patent application No. PCT/CN2019/114879 filed on Oct. 31, 2019, the entire disclosure of which is incorporated herein by reference as part of the present application.

TECHNICAL FIELD

Embodiments of the present disclosure relate to a flexible circuit board assembly and a display device.

BACKGROUND

With a rapid development of a display technology in recent years, a bezel-less screen becomes a hotspot in the consumer market. The bezel-less screen refers to a display panel having a screen-to-body ratio more than 90% and an ultra-narrow bezel design. A flexible printed circuit (FPC) board is beneficial to reduction of a width of a bezel of a display screen, thereby increasing the screen-to-body ratio, and currently, the FPC board is widely applied to various electronic products.

The flexible printed circuit board is made of a flexible insulating base material, and has many advantages not possessed by a rigid printed circuit board. For example, the flexible printed circuit board may be bent, wound and folded freely, and may be dynamically bent millions of times without damage to a wire, randomly arranged according to a spatial arrangement requirement, as well as moved and stretched at will in a three-dimensional space, thereby integrating component assembly and wire connection; with the FPC board, a volume of the electronic product may be reduced greatly, which meets a requirement of the development of a miniaturized electronic product with high density and reliability.

SUMMARY

An embodiment of the disclosure provides a display device. The display device comprises a display substrate, a touch module and a ring structure. The display substrate comprises a first portion for display, a second portion located at a non-display side of the first portion of the display substrate, and a first bent portion for connecting the first portion and the second portion, and a first driver is provided at a side of the second portion away from the first portion. The touch module comprises a touch layer and a touch flexible circuit board connected with the touch layer, and the touch flexible circuit board comprises a flat portion located at a side of the second portion away from the first portion and a second bent portion for connecting the touch layer and the flat portion. The ring structure is located between the flat portion of the touch flexible circuit board and the second portion of the display substrate, and the first driver is located in an accommodating space enclosed by the ring structure. The display device can prevent the flexible circuit board from being warped.

In some examples, the ring structure is connected with the flat portion of the touch flexible circuit board.

In some examples, the ring structure comprises a connection layer, a buffer layer and a heat transfer layer which are stacked in a direction perpendicular to the flat portion, the connection layer is connected with the flat portion, the buffer layer is located at a side of the connection layer away from the flat portion, and the heat transfer layer is located at a side of the buffer layer away from the flat portion.

In some examples, the connection layer comprises an adhesive layer which is adhered to the flat portion, the buffer layer comprises an elastic material layer, and the heat transfer layer comprises a metal layer.

In some examples, the ring structure has a polygonal-ring, circular-ring or elliptical-ring planar shape.

In some examples, the ring structure has a thickness of 0.1 mm to 0.5 mm in the direction perpendicular to the flat portion.

In some examples, the thickness of the ring structure in the direction perpendicular to the flat portion is greater than a height of the first driver.

In some examples, the ring structure is an unclosed ring structure.

In some examples, the touch flexible circuit board comprises a single-layer flexible circuit board and a multilayer flexible circuit board which are connected with each other, the single-layer flexible circuit board comprises the second bent portion and a part of the flat portion connected with the second bent portion, the multi-layer flexible circuit board comprises the other part of the flat portion, and the ring structure is located between the single-layer flexible circuit board and the second portion of the display substrate.

In some examples, the first driver is a display drive chip.

In some examples, the display device further comprises a display flexible circuit board which is connected with an end of the second portion away from the first bent portion and located between the second portion and the flat portion in the direction perpendicular to the flat portion.

In some examples, the display device further comprises a second driver at a side of the multilayer flexible circuit board away from the display substrate.

In some examples, the second driver is a touch drive chip.

In some examples, the display substrate is an organic light-emitting diode display substrate.

BRIEF DESCRIPTION OF DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise specified, the technical terms or scientific terms used in the disclosure have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly. The words "on", "beneath", "left", "right" and the like only indicate the relative position relationship which is correspondingly changed when the absolute position of a described object is changed.

Figure 1A:
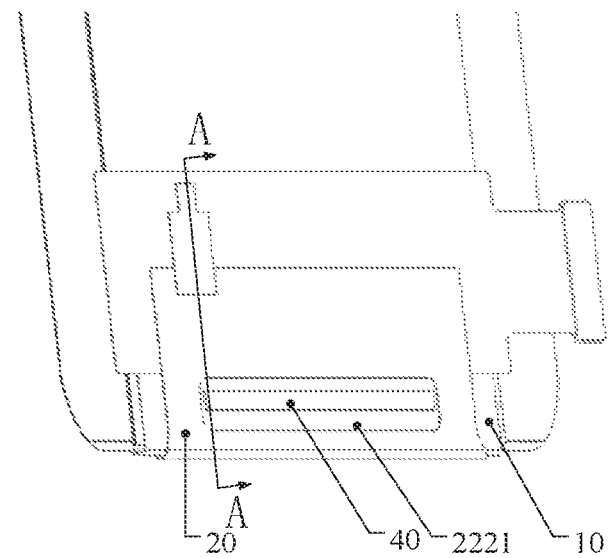
FIG. 1A is a schematic stereoscopic structure diagram of an organic light-emitting diode touch display device.
Figure 1B:
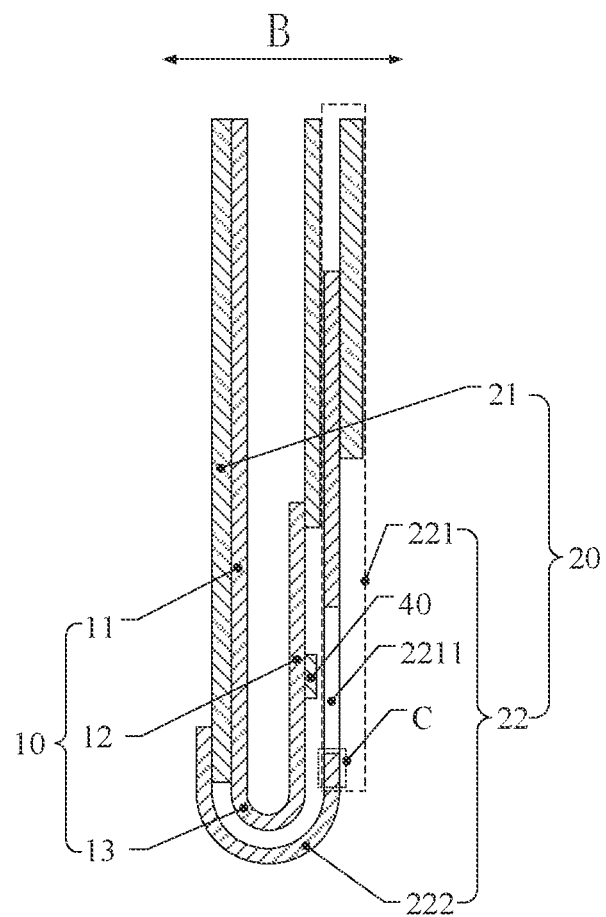
FIG. 1B is a schematic sectional structure diagram of the organic light-emitting diode touch display device shown in FIG. 1A along line A-A.

FIG. 1A is a schematic stereoscopic structure diagram of an organic light-emitting diode (OLED) touch display device, and FIG. 1B is a schematic sectional structure diagram of the OLED touch display device shown in FIG. 1A along line A-A. As shown in FIGS. 1A and 1B, the OLED touch display device includes an OLED display substrate 10 and a touch module 20. The display substrate 10 includes a first portion 11 for display, a second portion 12 located at a non-display side of the first portion 11, and a first bent portion 13 for connecting the first portion 11 and the second portion 12. The touch module 20 includes a touch layer 21 and a touch flexible circuit board 22 which are connected with each other. The touch flexible circuit board 22 includes a flat portion 221 located at a side of the second portion 12 away from the first portion 11, and a second bent portion 222 for connecting the touch layer 21 and the flat portion 221. In a direction B perpendicular to the display substrate 10, the second portion 12 of the display substrate 10 overlaps with the flat portion 221 of the touch flexible circuit board 22. For example, the touch layer 21 is connected with the OLED display substrate 10 and located at a display side thereof. The OLED touch display device further includes a first driver 40 bound to the side of the second portion 12 of the OLED display substrate 10 away from the first portion 11. The touch flexible circuit board 22 further includes an opening 2211 provided at the flat portion 221 and corresponding to the first driver 40. For example, in the direction B perpendicular to the display substrate, the first driver 40 falls within the opening 2211 completely. For example, an orthographic projection of the first driver 40 at the display substrate 10 falls within an orthographic projection of the opening 2211 at the display substrate. The opening 2211 is provided to prevent damage to the first driver 40 or the touch flexible circuit board 22 caused by a pressing action between the first driver 40 and the touch flexible circuit board 22.

Figure 2:
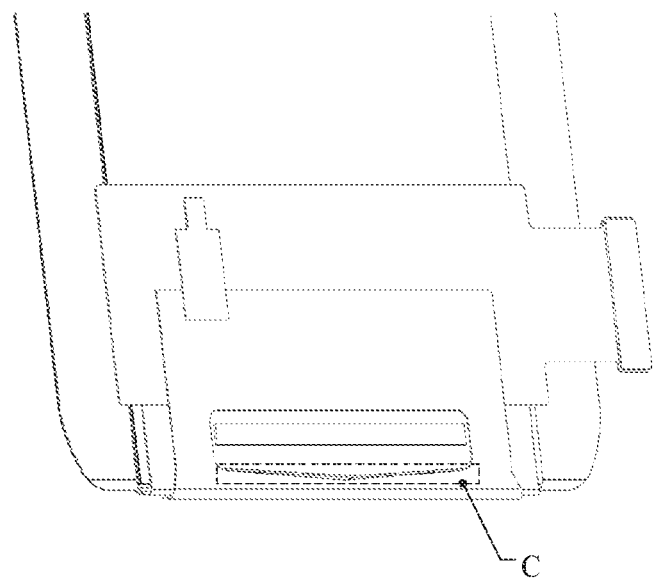
FIG. 2 is a schematic stereoscopic structure diagram in which the organic light-emitting diode touch display device has a warped touch flexible circuit board.

FIG. 2 is a schematic stereoscopic structure diagram in which the OLED touch display device shown in FIGS. 1A and 1B has the touch flexible circuit board warped close to the opening. As shown in FIGS. 1B and 2, a region C (region within a dashed box) of the touch flexible circuit board 22 adjacent to a lower edge of the opening 2211 is close to the second bent portion 222 of the touch flexible circuit board 22, such that a bending stress is generated inside the region C. In addition, the region C is thin, has the openings 2211 at an upper portion thereof and is not supported by a solid structure, and thus, warpage tends to occur at the region C, for example, as shown in FIG. 2. The warpage may cause a metal wire in the touch flexible circuit board to break, thereby causing a communication failure.

To solve the problem, embodiments of the present disclosure provide a flexible circuit board assembly and a display device. The display device also includes the display substrate and the touch module mentioned above. However, the touch flexible circuit board in the touch module does not include the opening. In addition, the display device further includes a ring structure located between the flat portion of the touch flexible circuit board and the second portion of the display substrate, and the first driver is located in an accommodating space enclosed by the ring structure. The flexible circuit board assembly and the display device may prevent the flexible circuit board from being warped. The embodiments of the present disclosure are described in detail below in conjunction with the accompanying drawings. It should be noted that the same reference numerals in different accompanying drawings are used to designate described elements having the same structures.

Figure 3A:
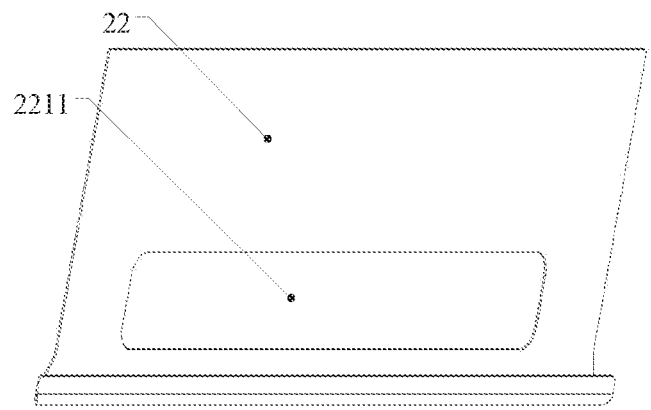
FIG. 3A is a schematic stereoscopic structure diagram of the touch flexible circuit board in the organic light-emitting diode touch display device shown in FIGS. 1A and 1B.
Figure 3B:
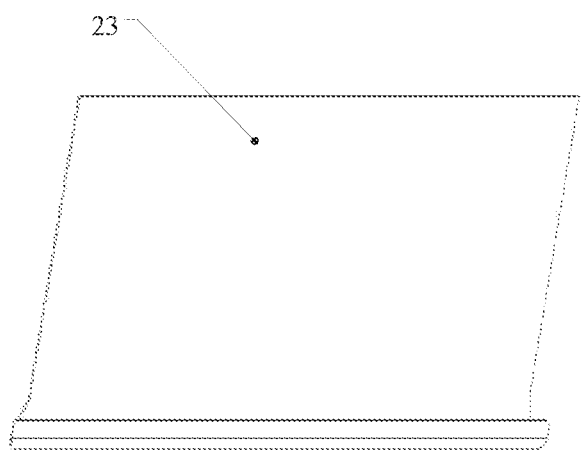
FIG. 3B is a schematic stereoscopic structure diagram of a touch flexible circuit board according to an embodiment of the present disclosure.

FIG. 3A is a schematic stereoscopic structure diagram of the touch flexible circuit board in the OLED touch display device shown in FIGS. 1A and 1B, and FIG. 3B is a schematic stereoscopic structure diagram of a touch flexible circuit board according to an embodiment of the present disclosure. On the basis of the touch flexible circuit board 22 shown in FIG. 3A, the touch flexible circuit board 23 as shown in FIG. 3B is formed by omitting the opening 2211. Omission of the opening 2211 may not only increase a structural strength of the region C to prevent the region C from being warped, but also omit an opening process of the touch flexible circuit board to save a manufacturing cost. After the opening 2211 is omitted, the embodiment of the present disclosure further provides a further structure of the touch flexible circuit board, so as to prevent the first driver 40 and the touch flexible circuit board 23 from being pressed against each other when the touch flexible circuit board 23 is bent to the non-display side, and the further structure of the touch flexible circuit board 23 is described in detail below.

Figure 4A:
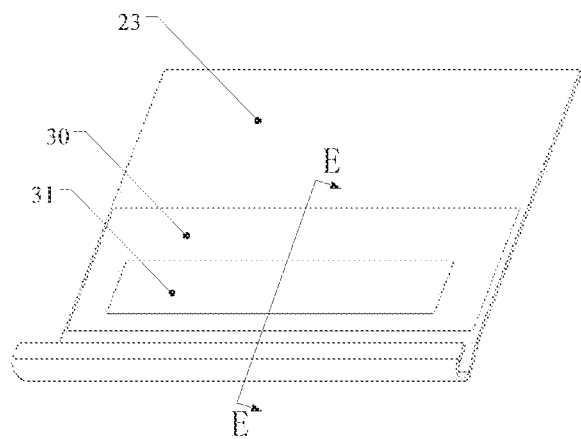
FIG. 4A is a schematic stereoscopic structure diagram of a flexible circuit board assembly according to an embodiment of the present disclosure.
Figure 4B:
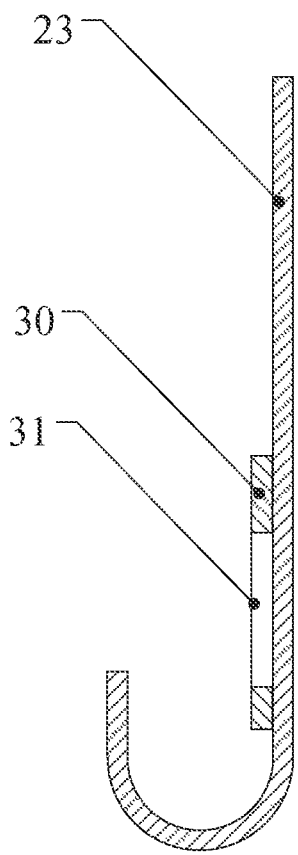
FIG. 4B is a schematic sectional structure diagram of the flexible circuit board assembly shown in FIG. 4A along line E-E.

An embodiment of the present disclosure provides a flexible circuit board assembly. FIG. 4A is a schematic stereoscopic structure diagram of the flexible circuit board assembly according to an embodiment of the present disclosure, and FIG. 4B is a schematic sectional structure diagram of the flexible circuit board assembly shown in FIG. 4A along line E-E. As shown in FIGS. 4A and 4B, the flexible circuit board assembly includes a touch flexible circuit board 23 and a ring structure 30 which is located at a surface of the touch flexible circuit board 23 at one side of the touch flexible circuit board 23 and protrudes from the surface to form an accommodating space 31 at an inner side of the ring structure 30. In a touch display device including the flexible circuit board assembly, for example, a touch display device formed by replacing the touch flexible circuit board 22 in the touch display device shown in FIG. 1A with the flexible circuit board assembly, the accommodating space 31 has a position corresponding to the opening 2211 in the OLED touch display device. That is, the accommodating space 31 corresponds to the first driver 40 in FIG. 1A, and the first driver 40 completely falls within the accommodating space 31 in the direction perpendicular to the display substrate. Therefore, the accommodating space 31 may accommodate the first driver 40 to prevent the first driver 40 and the touch flexible circuit board 23 from being pressed against each other. By adding the ring structure with the accommodating space at the touch flexible circuit board, the touch flexible circuit board may be prevented from being warped, and the first driver and the touch flexible circuit board may be prevented from being pressed against each other.

It should be noted that the accommodating space 31 is not limited to accommodate the first driver, may also accommodate other components, and plays a role in preventing the components and the touch flexible circuit board from being pressed against each other.

Figure 5A:
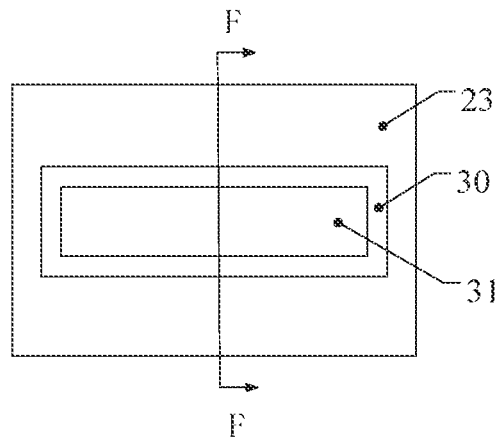
FIG. 5A is a schematic planar structure diagram of the flexible circuit board assembly in a flattened state according to an embodiment of the present disclosure.
Figure 5B:
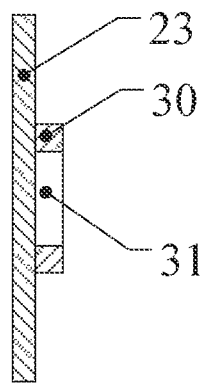
FIG. 5B is a sectional view taken along line F-F of FIG. 5A.

An embodiment of the present disclosure further provides a flexible circuit board assembly including the touch flexible circuit board 23 and the ring structure 30 which are mentioned above. FIG. 5A is a schematic planar structure diagram of the flexible circuit board assembly in a flattened state according to an embodiment of the present disclosure, and FIG. 5B is a sectional view taken along line F-F of FIG. 5A. As shown in FIGS. 5A and 5B, the ring structure 30 and the touch flexible circuit board 23 are connected to form the flexible circuit board assembly. For example, the ring structure 30 may be directly adhered to the touch flexible circuit board 23. As such, the flexible circuit board assembly has a simple structure and is convenient to assemble.

Figure 6A:
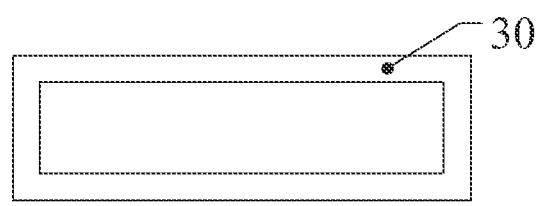
FIG. 6A is a schematic planar structure diagram of a ring structure according to an embodiment of the present disclosure.
Figure 6B:
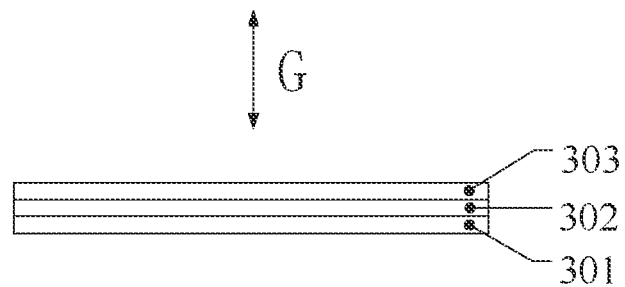
FIG. 6B is a top view of the ring structure according to an embodiment of the present disclosure.

FIG. 6A is a schematic planar structure diagram of the ring structure according to an embodiment of the present disclosure, and FIG. 6B is a top view of the ring structure. As shown in FIG. 6B, in a direction G perpendicular to the touch flexible circuit board 23, the ring structure 30 includes a connection layer 301, a buffer layer 302 and a heat transfer layer 303 which are stacked sequentially. The ring structure 30 is connected to a surface of the touch flexible circuit board 23 at one side of the touch flexible circuit board 23 by the connection layer 301, the buffer layer 302 is connected with a surface of the connection layer 301 at one side of the connection layer 301 away from the touch flexible circuit board 23, and the heat transfer layer 303 is connected with a surface of the buffer layer 302 at one side of the buffer layer 302 away from the touch flexible circuit board 23.

In some examples, the connection layer 301 is configured as a double sided tape layer which has one surface adhered to the surface of the touch flexible circuit board and another surface adhered to the buffer layer 302. The connection layer plays a role in connecting the ring structure with the touch flexible circuit board.

In some examples, the buffer layer 302 is configured as an elastic material layer which has a surface connected with the surface of the connection layer 301 away from the touch flexible circuit board 23. For example, the elastic material layer is made of foam. The foam has an excellent buffer performance, and may prevent damage to the driver caused by pressure of the flexible circuit board.

In some examples, the heat transfer layer 303 is configured as a metal layer which has a surface connected with the surface of the buffer layer 302 away from the flexible circuit board. For example, the metal layer is made of copper foil. The copper foil has a good thermal conductivity, which is beneficial to heat dissipation of the first driver.

In some examples, a layer of glue is provided at the surface of the metal layer close to the buffer layer, so as to adhere the metal layer and the buffer layer; or a layer of glue is provided at the surface of the buffer layer close to the metal layer, so as to adhere the metal layer and the buffer layer. As such, the metal layer is adhered to the buffer layer adhered to the connection layer, so as to form the stable ring structure by the metal layer, the buffer layer and the connection layer.

In some examples, planar shapes of the ring structure and the accommodating space may be selected according to a shape of the corresponding driver. For example, the driver is rectangular, and correspondingly, the ring structure has a rectangular-ring planar shape, and the accommodating space therein has a rectangular planar shape. Certainly, the ring structure and the accommodating space have shapes which are not limited thereto, and the ring structure may also have a polygonal-ring, circular-ring or elliptical-ring planar shape, for example. Therefore, the formed accommodating space may also have a polygonal, circular or elliptical planar shape.

Figure 7A:
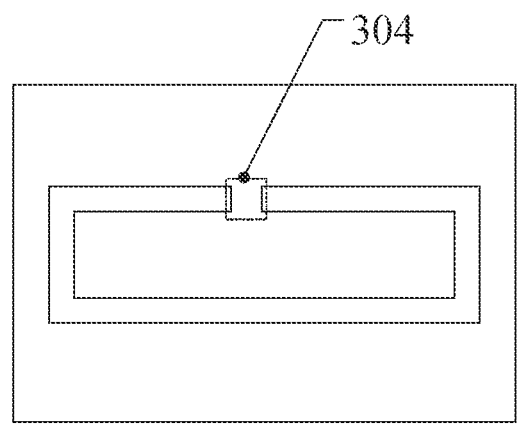
FIG. 7A is a schematic planar structure diagram of another ring structure according to an embodiment of the present disclosure.
Figure 7B:
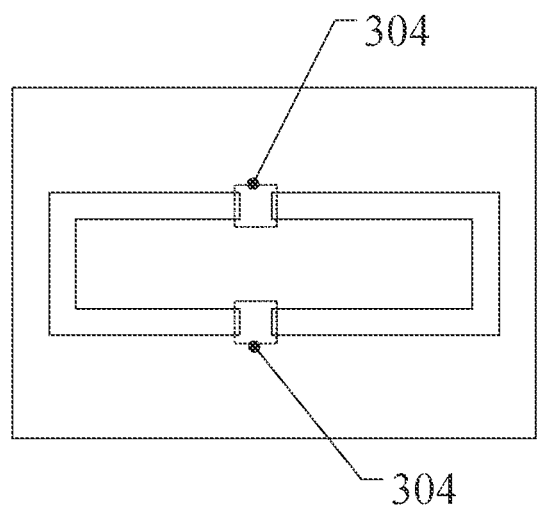
FIG. 7B is a schematic planar structure diagram of yet another ring structure according to an embodiment of the present disclosure.

The ring structure shown in FIG. 6A is a closed ring structure, but may also be unclosed. FIG. 7A is a schematic planar structure diagram of another ring structure according to an embodiment of the present disclosure, and FIG. 7B is a schematic planar structure diagram of yet another ring structure according to an embodiment of the present disclosure. As shown in FIG. 7A, the ring structure 30 is unclosed and has a notch 304. Certainly, the notches 304 may be provide in plural, and the notches are provided at the ring structure at intervals respectively. For example, as shown in FIG. 7B, the ring-shaped structure has two notches 304 symmetrically provided up and down in the drawing. The ring structure may also have other unclosed forms, and the notch of the ring structure is not limited in the present disclosure. The arrangement of the notch facilitates an increase in air circulation, thereby further increasing a heat dissipation efficiency of the driver by means of convection heat dissipation.

In some examples, a depth of the accommodating space (i.e., a thickness of the ring structure) is required to be selected according to a thickness of the driver. For example, the depth of the accommodating space is greater than the thickness of the driver, such that a top of the driver does not come into contact with the touch flexible circuit board, and as such, the driver and the touch flexible circuit board may be prevented from being pressed against each other. For example, the depth of the accommodating space ranges from 0.1 mm to 0.5 mm.

Figure 8A:
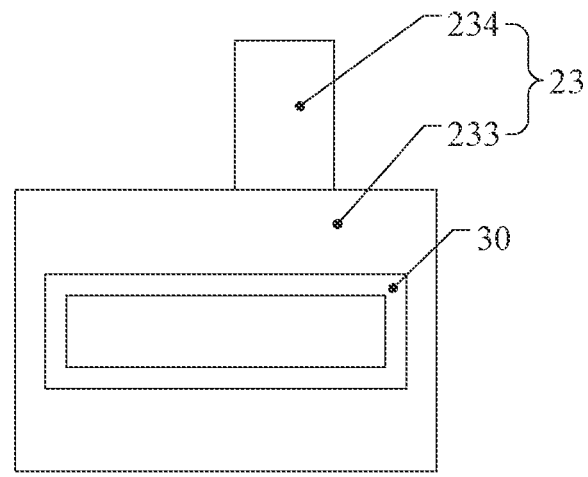
FIG. 8A is another schematic planar structure diagram of the flexible circuit board assembly according to an embodiment of the present disclosure.
Figure 8B:
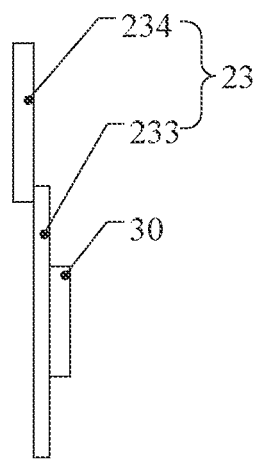
FIG. 8B is a schematic side diagram of the structure of FIG. 8A.

For example, the touch flexible circuit board 23 may have a single-layer structure or a multilayer structure, or have one part configured as a single-layer circuit board and the other part configured as a multilayer circuit board. FIG. 8A is another schematic planar structure diagram of the flexible circuit board assembly according to an embodiment of the present disclosure, and FIG. 8B is a schematic side diagram of the structure of FIG. 8A. As shown in FIGS. 8A and 8B, the touch flexible circuit board 23 includes a first part 233 and a second part 234 which are connected with each other, and the first part 233 has a thickness not greater than that of the second part 234. For example, the ring structure 30 is located at the first part 233.

The multilayer flexible circuit board has a high manufacturing cost and a long manufacturing period. In order to save the manufacturing cost, in some examples, a part of the multilayer flexible circuit board is replaced with a single-layer flexible circuit board, such that the touch flexible circuit board 23 is formed by combining the single-layer flexible circuit board and the multilayer flexible circuit board.

For example, in the flexible circuit board assembly shown in FIGS. 8A and 8B, the first part 233 of the touch flexible circuit board 23 is configured as a single-layer flexible circuit board 233, and the second part 234 is configured as a multilayer flexible circuit board 234.

The single-layer flexible circuit board includes a base material layer and a conducting layer. The base material layer is made of, for example, polyimide, and the conducting layer is made of, for example, copper foil. The multilayer flexible circuit board includes a base material layer as well as a plurality of conducting layers and a plurality of insulating layers which are stacked alternately, and conducting holes are formed between the plurality of conducting layers and the plurality of insulating layers for electrically connecting a plurality of circuit layers.

The single-layer flexible circuit board has a simple structure, and thus has a manufacturing cost much less than the multilayer flexible circuit board. The single-layer flexible circuit board has a thickness less than the multilayer flexible circuit board, and thus has a better bendability than the multilayer flexible circuit board. Since the single-layer flexible circuit board is simpler than the multilayer flexible circuit board, replacement of a part of the multilayer flexible circuit board with the single-layer flexible circuit board may save the manufacturing cost of the flexible circuit board and increase the bendability thereof.

In some examples, as shown in FIGS. 8A and 8B, the ring structure 30 is connected to the single-layer flexible circuit board 233 of the touch flexible circuit board 23, and plays a role in reinforcing the single-layer flexible circuit board to prevent warpage.

Figure 9:
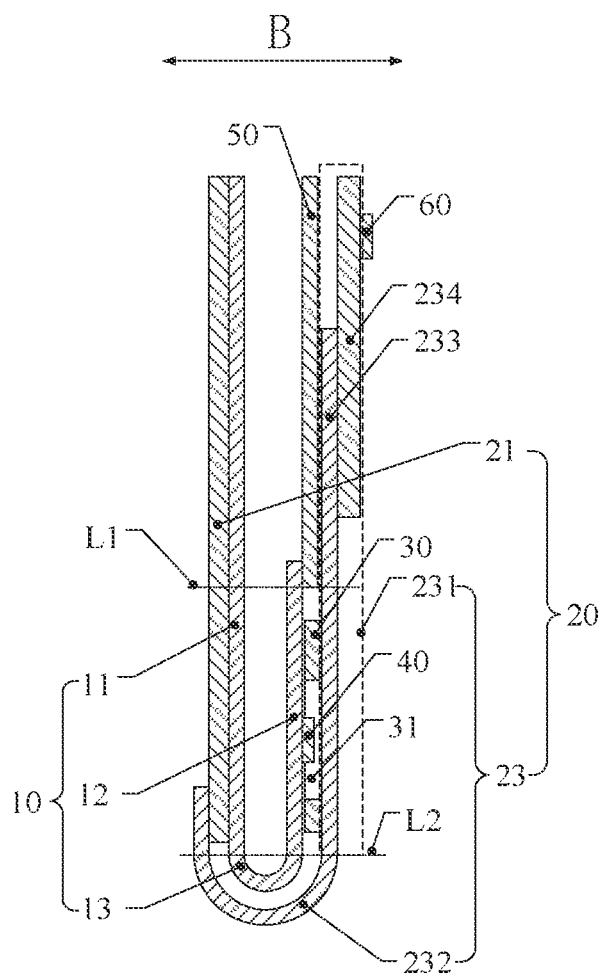
FIG. 9 is a schematic structural diagram of a display device according to an embodiment of the present disclosure.

An embodiment of the present disclosure provides a display device. FIG. 9 is a schematic structural diagram of the display device according to an embodiment of the present disclosure. As shown in FIG. 9, the display device includes a display substrate 10, a touch module 20 and a ring structure 30. The display substrate 10 includes a first portion 11 for display, a second portion 12 located at a non-display side of the first portion 11, and a first bent portion 13 for connecting the first and second portions 11, 12. The touch module 20 includes a touch layer 21 and a touch flexible circuit board 23 which are connected with each other. The touch flexible circuit board 23 includes a flat portion 231 located at a side of the second portion 12 away from the first portion 11, and a second bent portion 232 for connecting the touch layer 21 and the flat portion 231. The ring structure 30 is located between the flat portion 231 of the touch flexible circuit board 23 and the second portion 12 of the display substrate 10. In a direction B perpendicular to the display substrate 10, the second portion 12 of the display substrate 10 overlaps with the flat portion 221 of the touch flexible circuit board 22. For example, the touch layer 21 is connected with the display substrate 10 and located at a display side thereof. The display device further includes a first driver 40 which is bonded to a side of the second portion 12 of the display substrate 10 away from the first portion 11, and located in an accommodating space 31 enclosed by the ring structure 30. For example, the touch flexible circuit board 23 and the ring structure 30 form the above-mentioned flexible circuit board assembly.

The first driver is bonded to the side of the second portion 12 of the display substrate 10 away from the first portion 11, which may remarkably reduce a width of a lower bezel of the display device, thereby increasing a screen-to-body ratio of the display device greatly and facilitating a bezel-less screen design. The first driver 40 is located in the accommodating space 31 enclosed by the ring structure 30, which may prevent damage to the first driver 40 and the touch flexible circuit board 23 caused by pressure against each other. In addition, compared with the touch flexible circuit board 22, the opening is omitted in the touch flexible circuit board 23, which may prevent the flexible circuit board from being warped. The ring structure 30 is added at the original opening position of the flexible circuit board, which may increase a strength of the position to further prevent the flexible circuit board from being warped.

For example, as shown in FIG. 9, the ring structure 30 is adhered to the flat portion 231 of the touch flexible circuit board 23.

For example, the ring structure 30 includes a connection layer 301, a buffer layer 302 and a heat transfer layer 303 which are stacked sequentially. The ring structure 30 is connected to a surface of the touch flexible circuit board 23 by the connection layer 301, the buffer layer 302 is connected with a surface of the connection layer 301 away from the touch flexible circuit board 23, and the heat transfer layer 303 is connected with a surface of the buffer layer 302 away from the touch flexible circuit board 23.

For example, the touch flexible circuit board 23 includes a first part 233 and a second part 234 which are connected with each other, and the first part 233 has a thickness not greater than that of the second part 234. For example, the first part 233 is configured as a single-layer flexible circuit board 233, and the second part 234 is configured as a multilayer flexible circuit board 234. The single-layer flexible circuit board 233 is bent at an edge of the display substrate 10, and the ring structure 30 is located at a part of the single-layer flexible circuit board 233 bent to the non-display side of the display substrate 10. For example, the multilayer flexible circuit board 234 is located at the non-display side of the display substrate 10.

It should be noted that the touch flexible circuit board 23 is divided into the single-layer and multilayer flexible circuit boards 233, 234 according to the number of layers of the circuit board, and into the flat portion 231 and the second bent portion 232 according to the shape in the display device. The flat portion 231, the second bent portion 232 as well as the single-layer and multilayer flexible circuit boards 233, 234 are structurally in a nonparallel relationship, but have overlapping parts.

In some examples, as shown in FIG. 9, the display device further includes a second flexible circuit board 50 connected with the display substrate 10. For example, the second flexible circuit board 50 is connected with an upper end of the second portion 12 of the display substrate 10, and located above the first driver 40 in an up-down direction in the drawing. In the direction B perpendicular to the display substrate, the second flexible circuit board 50 overlaps with the flat portion 231 of the touch flexible circuit board 23, and is located between the second portion 12 of the display substrate 10 and the flat portion 231 of the touch flexible circuit board 23. The second flexible circuit board 50 is configured as a display flexible circuit board, and a plurality of components are bonded to the second flexible circuit board to achieve different functions of the display device. For example, a data drive circuit and a scan drive circuit are bonded to the second flexible circuit board 50 for supplying a data signal and a scanning signal to the first driver.

In some examples, as shown in FIG. 9, a lower end of the second flexible circuit board 50 has a projection line L1 at the flat portion 231 of the touch flexible circuit board 23, and the second bent portion 232 of the touch flexible circuit board 23 includes a bend ending line L2. For example, an interface between the second bent portion 232 and the flat portion 231 of the touch flexible circuit board 23 in the drawing serves as the bend ending line L2.

Figure 10A:
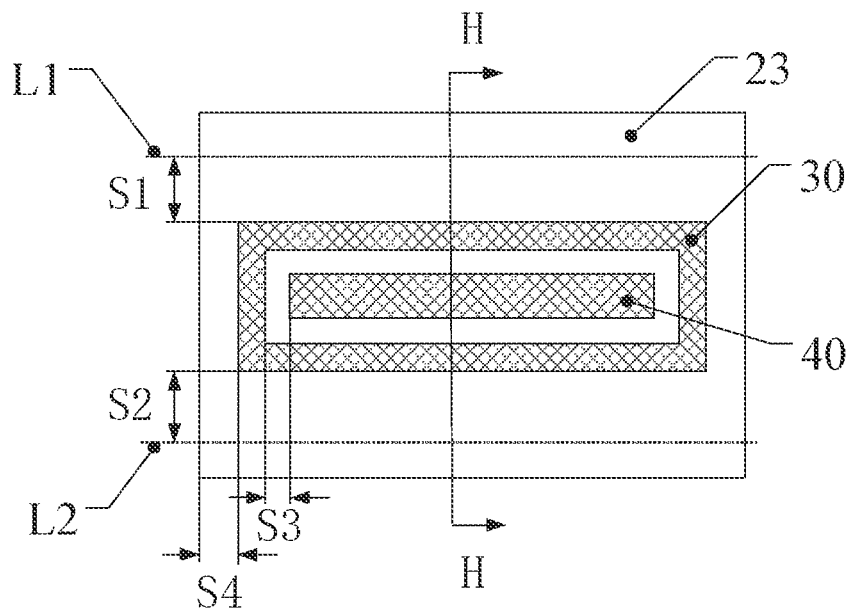
FIG. 10A is a schematic diagram of relative positions of the ring structure and a first driver.
Figure 10B:
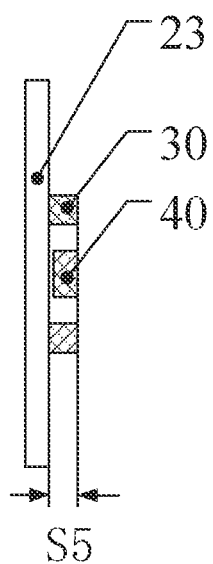
FIG. 10B is a schematic sectional structure diagram taken along line H-H in FIG. 10A.

FIG. 10A is a schematic diagram of relative positions of the ring structure and a first driver, and FIG. 10B is a schematic sectional structure diagram taken along line H-H in FIG. 10A. As shown in FIG. 10A, with the projection line L1 of the lower end of the second flexible circuit board 50 at the flat portion 231 of the touch flexible circuit board 23 as a reference, S1 is a distance from an upper edge of the ring structure 30 to the projection line L1. Since an adhesive spills to a certain degree after double sided tape of the ring structure is adhered to the touch flexible circuit board, S1 should be greater than a size of the upward spilling adhesive of the double sided tape in FIG. 10A. In addition, a shape tolerance of the touch flexible circuit board and a fitting tolerance of the ring structure are also considered when S1 is calculated. For example, S1 ranges from 0.8 mm to 1.5 mm. S2 is a distance from a lower edge of the ring structure to the bend ending line L2 with the bend ending line L2 as a reference. Similarly, S2 should be greater than a size of the downward spilling adhesive of the double sided tape in FIG. 10A, and the shape tolerance of the touch flexible circuit board and the fitting tolerance of the ring structure are also considered when S2 is calculated. For example, S2 ranges from 0.8 mm to 1.5 mm.

As shown in FIG. 10A, S3 is a distance from a left lateral side of the accommodating space of the ring structure to a left lateral side of the first driver, and should be greater than a size of the rightward spilling adhesive of the double sided tape in FIG. 10A. In addition, the shape tolerance of the touch flexible circuit board, the fitting tolerance of the ring structure and a bonding position tolerance of the first driver are also considered when S3 is calculated. For example, four lateral sides of the accommodating space have equal distances from four lateral sides of the first driver, and the distances are S3. For example, S3 ranges from 1 mm to 2 mm.

S4 is a distance from a left lateral side of the ring structure to a left lateral side of the touch flexible circuit board. Similarly, S4 should be greater than a size of the leftward spilling adhesive of the double sided tape in FIG. 10A, and the shape tolerance of the touch flexible circuit board and the fitting tolerance of the ring structure are also considered when S4 is calculated. For example, S4 ranges from 0.8 mm to 1.5 mm.

S5 is the depth of the accommodating space (i.e. the thickness of the ring structure). For example, the ring structure is made of copper foil, foam and the double sided tape, and S5 is a sum of a thickness of the copper foil, a thickness of the foam and a thickness of the double sided tape.

The depth S5 of the accommodating space of the ring structure may be designed according to the thickness of the first driver, and is greater than the thickness of the first driver. Different requirements for the depth S5 of the accommodating space of the ring structure may be met by selecting the double sided tape, the foam and the copper foil with different specifications. For example, the copper foil has a thickness of 0.03 mm, the foam has a thickness of 0.1 mm, 0.15 mm, 0.2 mm, or the like, and the double sided tape has a thickness of 0.03 mm, 0.04 mm, 0.05 mm, or the like. The first driver has a thickness of 0.19 mm, 0.25 mm, or the like. For example, for the first driver with a thickness of 0.19 mm, the ring structure may be made of copper foil with a thickness of 0.03 mm, foam with a thickness of 0.15 mm and double sided tape with a thickness of 0.03 mm, and the formed ring structure has a thickness of 0.21 mm, which is greater than that of the first driver. Certainly, the ring structure may also be made of the raw materials with other specifications, as long as the depth of the accommodating space is greater than the thickness of the first driver.

The accommodating space of the ring structure has a depth greater than a height of the first driver, which may ensure that the top of the first driver does not come into contact with the touch flexible circuit board. The first driver does not come into contact with the touch flexible circuit board assembly, which may prevent the first driver and the touch flexible circuit board from being pressed against each other.

In some examples, the display substrate is configured as an organic light-emitting diode (OLED) display substrate, and the first driver 40, configured as a display drive chip, is directly bonded to the OLED display substrate, for driving the OLED display substrate to perform display.

In some examples, as shown in FIG. 9, the display device according to the embodiment of the present disclosure further includes a second driver 60 which is bonded to the second portion 12 of the touch flexible circuit board 23 and located at a side of the second portion 12 away from the display substrate 10. The second driver 60 is connected with the touch layer 21 by the touch flexible circuit board 23. For example, the second driver 6 is configured as a touch drive chip, for driving the touch module 20 of the display device to achieve a touch function. For example, a chip on film (COF) is formed by the second driver 60 and the touch flexible circuit board 23.

In some examples, the touch drive chip 60 is bonded to the multilayer flexible circuit board 234 of the touch flexible circuit board 23. Other components may be further bonded to the multilayer flexible circuit board 234, which is not limited in the present disclosure.

For example, the display device according to the embodiment of the present disclosure may be implemented as any product or component with a displaying function, such as a liquid crystal panel, electronic paper, an organic light-emitting diode panel, a mobile phone, a tablet computer, a television, a display, a notebook computer, a digital photo frame, a navigator, or the like.

The following points should be noted:

(1) Only the structures relevant to the embodiments of the present invention are involved in the accompanying drawings of the embodiments of the present invention, and other structures may refer to the prior art.

(2) The embodiments of the present invention and the characteristics in the embodiments may be mutually combined without conflict.

The foregoing is only the preferred embodiments of the present invention and not intended to limit the scope of protection of the present invention. Any change or replacement that may be easily thought of by those skilled in the art within the technical scope disclosed by the present invention shall fall within the scope of protection of the present invention. Therefore, the scope of protection of the present invention shall be defined by the appended claims.

The invention claimed is:

1. A display device, comprising:
   a display substrate comprising a first portion for display, a second portion located at a non-display side of the first portion of the display substrate, and a first bent portion for connecting the first portion and the second portion, a first driver being provided at a side of the second portion away from the first portion;
   a touch module comprising a touch layer and a touch flexible circuit board connected with the touch layer, the touch flexible circuit board comprising a flat portion located at a side of the second portion away from the first portion and a second bent portion for connecting the touch layer and the flat portion; and
   a supporting structure between the flat portion of the touch flexible circuit board and the second portion of the display substrate, wherein the supporting structure is located on at least one side of the first driver in a direction parallel to the flat portion of the touch flexible circuit board.

2. The display device according to claim 1, wherein the supporting structure is connected with the flat portion of the touch flexible circuit board.

3. The display device according to claim 1, wherein the supporting structure comprises a connection layer, a buffer layer and a heat transfer layer which are stacked in a direction perpendicular to the flat portion, the connection layer is connected with the flat portion, the buffer layer is located at a side of the connection layer away from the flat portion, and the heat transfer layer is located at a side of the buffer layer away from the flat portion.

4. The display device according to claim 3, wherein the connection layer comprises an adhesive layer which is adhered to the flat portion, the buffer layer comprises an elastic material layer, and the heat transfer layer comprises a metal layer.

5. The display device according to any claim 1, wherein the supporting structure has a planar shape of polygonal-ring, circular-ring or elliptical-ring.

6. The display device according to claim 1, wherein the supporting structure has a thickness of 0.1 mm to 0.5 mm in the direction perpendicular to the flat portion.

7. The display device according to claim 1, wherein the thickness of the supporting structure in the direction perpendicular to the flat portion is greater than a height of the first driver.

8. The display device according to claim 1, wherein the supporting structure is an unclosed ring structure.

9. The display device according to claim 1, wherein the touch flexible circuit board comprises a single-layer flexible circuit board and a multilayer flexible circuit board which are connected with each other, the single-layer flexible circuit board comprises the second bent portion and a part of the flat portion connected with the second bent portion, the multi-layer flexible circuit board comprises the other part of the flat portion, and the supporting structure is located between the single-layer flexible circuit board and the second portion of the display substrate.

10. The display device according to claim 1, wherein the first driver is a display drive chip.

11. The display device according to claim 1, further comprising a display flexible circuit board which is connected with an end of the second portion away from the first bent portion and located between the second portion and the flat portion in the direction perpendicular to the flat portion.

12. The display device according to claim 9, further comprising a second driver at a side of the multilayer flexible circuit board away from the display substrate.

13. The display device according to claim 12, wherein the second driver is a touch drive chip.

14. The display device according to claim 1, wherein the display substrate is an organic light-emitting diode display substrate.

* * * * *